(12) United States Patent
Haffner

(10) Patent No.: US 7,669,173 B2
(45) Date of Patent: Feb. 23, 2010

(54) SEMICONDUCTOR MASK AND METHOD OF MAKING SAME

(75) Inventor: Henning Haffner, Pawling, NY (US)

(73) Assignee: Infineon Technologies AG, Munich (DE)

( * ) Notice: Subject to any disclaimer, the term of this patent is extended or adjusted under 35 U.S.C. 154(b) by 502 days.

(21) Appl. No.: 11/635,322

(22) Filed: Dec. 7, 2006

(65) Prior Publication Data

US 2008/0141212 A1   Jun. 12, 2008

(51) Int. Cl.
*G06F 17/50* (2006.01)
(52) U.S. Cl. .............................. 716/20; 716/19; 716/21
(58) Field of Classification Search ....................... None
See application file for complete search history.

(56) References Cited

U.S. PATENT DOCUMENTS

| | | | |
|---|---|---|---|
| 5,808,892 A * | 9/1998 | Tu | 700/121 |
| 6,523,162 B1 * | 2/2003 | Agrawal et al. | 716/19 |
| 6,737,199 B1 | 5/2004 | Hsieh | |
| 6,767,674 B2 | 7/2004 | Carpi | |
| 6,887,630 B2 * | 5/2005 | Luttrell | 430/5 |
| 2005/0091632 A1 | 4/2005 | Pierrat et al. | |

* cited by examiner

*Primary Examiner*—Leigh Marie Garbowski
(74) *Attorney, Agent, or Firm*—Slater & Matsil, L.L.P.

(57) ABSTRACT

A method of making a semiconductor device is disclosed. A target mask pattern is provided which includes features to be exposed on the mask, and features to be non-exposed on the mask. The to be exposed features are fractured by searching for geometries on the target mask pattern that meet one or more conditions, identifying mask pattern structures to be fractured, fracturing the identified pattern structures according to a fracture instruction list, creating a set of mask exposure patterns, exposing the mask to the mask exposure pattern, and developing the mask.

30 Claims, 4 Drawing Sheets

SEMICONDUCTOR MASK AND METHOD OF MAKING SAME

TECHNICAL FIELD

This invention relates generally to the fabrication of semiconductor devices, and more particularly to patterning masks and methods.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or do not operate at all. For example, transistors can be created with improperly sized gates, conductors can be created that are short circuited or open circuited with other conductors or devices, structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate that is subsequently followed with a variety of processes to either subtract (for example, etch) and add (for example, deposit) materials from and to the semiconductor substrate.

One of the sources of error in the production of semiconductor devices is an error in the mask generation process. Even though the masks used for semiconductor lithography are usually 4x the size of the target image, tolerances of the mask itself are often much smaller than the minimum feature size in the semiconductor process due to small feature size adjustments needed for Optical Proximity Correction (OPC). To obtain the necessary mask resolution for fine geometry processes, the typical mask generation system may use an Electron Beam Exposure system, although lasers are also used in some mask generation processes. Reticle or mask substrates, made of a highly polished piece of fused silica are coated with a material such a chromium using sputtering. A thin layer of resist is applied to the mask substrate, and the substrate is exposed to an electron beam to pattern the mask. The electron beam exposes the resist, and then the mask is typically formed using a wet or dry etch process.

Because of the relatively narrow width of the electron beam, however, the shapes and patterns to be exposed on the mask are typically wider than the maximum beam width of the electron beam exposure system. As such, geometric features need to be fractured and patterned using multiple electron beam exposures. Some electron beam systems use a fixed shape beam, while other systems use a variable width beam. As the mask is exposed, the mask or reticle is mechanically stepped. The process of mechanically stepping and exposing the mask to multiple step and repeat exposures has, in itself, the possibility of introducing error. In stepped regions where exposed areas are adjoining non-exposed areas of a minimum or critical dimension, stepping error at the boundaries of the beam may accumulate and cause mask tolerance errors.

Conventional mask generation processes typically fracture the exposed area of the mask into small electron beam exposure regions. In the past, these fracturing algorithms have been prone to produce small slivers of exposure in areas to be exposed, as well as being prone to create irregular and non-uniform exposure patterns in regular exposed structures like DRAM and other forms of memory. Non-uniform fracturing in memory cells can lead to the possibility of yield failure and irregular electronic performance across the memory array. What is needed is a fracturing method that will ensure regular uniform fracturing along regular array structures.

SUMMARY OF THE INVENTION

In one embodiment, a semiconductor mask is fabricated. A target mask pattern is provided which includes features to be exposed on the mask, and features to be non-exposed on the mask. The features to be exposed on the mask are then fractured. The fracturing of the features comprises searching for geometries on the target mask pattern that meet one or more conditions, identifying mask pattern structures to be fractured, and fracturing the identified pattern structures according to the fracture instruction list. A set of mask exposure patterns are created, the mask is exposed to the mask exposure pattern, and the mask is developed.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely the creation of a semiconductor lithography mask. Concepts of the invention can also be applied, however, to other electronic devices. For one example, other forms of microlithography can utilize concepts of the present invention.

Figure 1:
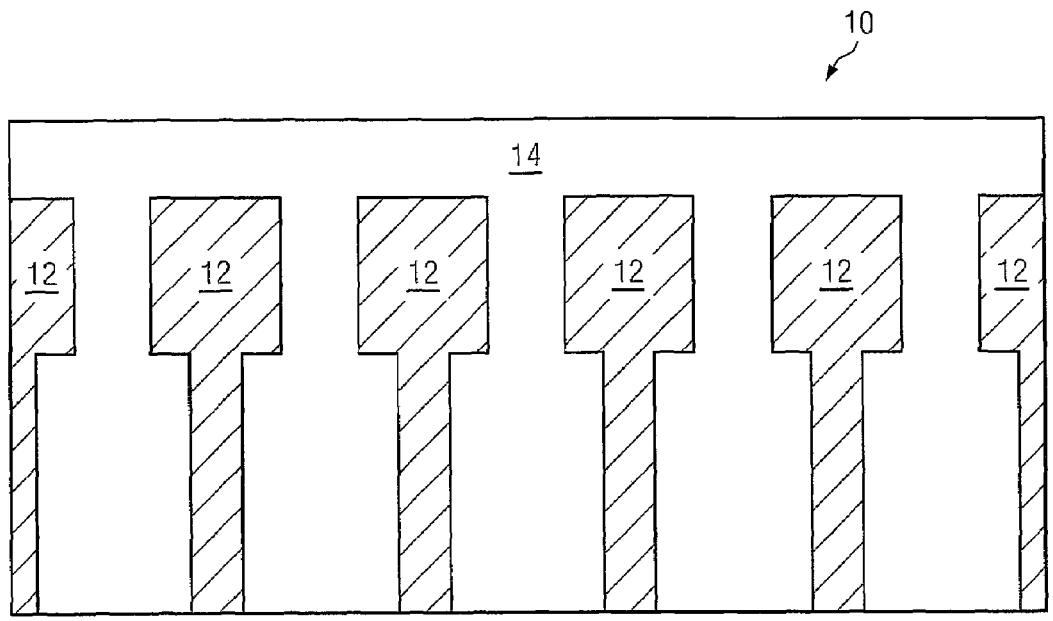
FIG. 1 illustrates a target mask pattern.

An exemplary target mask pattern 10 is shown in FIG. 1. The target mask pattern 10 includes an exposed region 14 and non-exposed regions 12. Exposed region 14 corresponds to a region on the mask exposed to an electron beam during mask fabrication. The mask to be exposed can be made from a highly polished plate of fused silica coated with chromium. The mask can be coated with a thin layer of resist sensitive to exposure by an electron beam. After the mask is exposed to the electron beam, the chromium on the exposed regions can be wet or dry etched away. Other forms of exposure, such as a laser beam for example, can be used. Additionally, the mask can also be made of other materials, such as anti-reflective layers, molybdenum silicide, nitrides, oxides, and other composite materials.

For the purposes of explanation, however, it will be assumed that regions of the resist that are exposed to the electron beam are the regions where the chromium coating is removed, thereby leaving a transparent or semi-transpararent region on the mask, i.e., the resist is a positive resist. In other mask making processes the exposed regions correspond to areas where the opaque coating remains on the mask, and the non-exposed regions are removed during etching, i.e., the resist is a negative resist. In other words, the concepts of the invention described herein can apply to masks using either positive or negative resist.

Typically the target mask pattern 10 will be provided in a computer readable format. The target mask pattern 10 can be a direct representation of the layout, but more typically, the layout design has been modified to include resolution enhancement techniques such as optical proximity correction (OPC). The data format of the target mask pattern is typically in a data format called VSB (variable shaped beam), but other data formats, such as CFLT, may be used.

Figure 2:
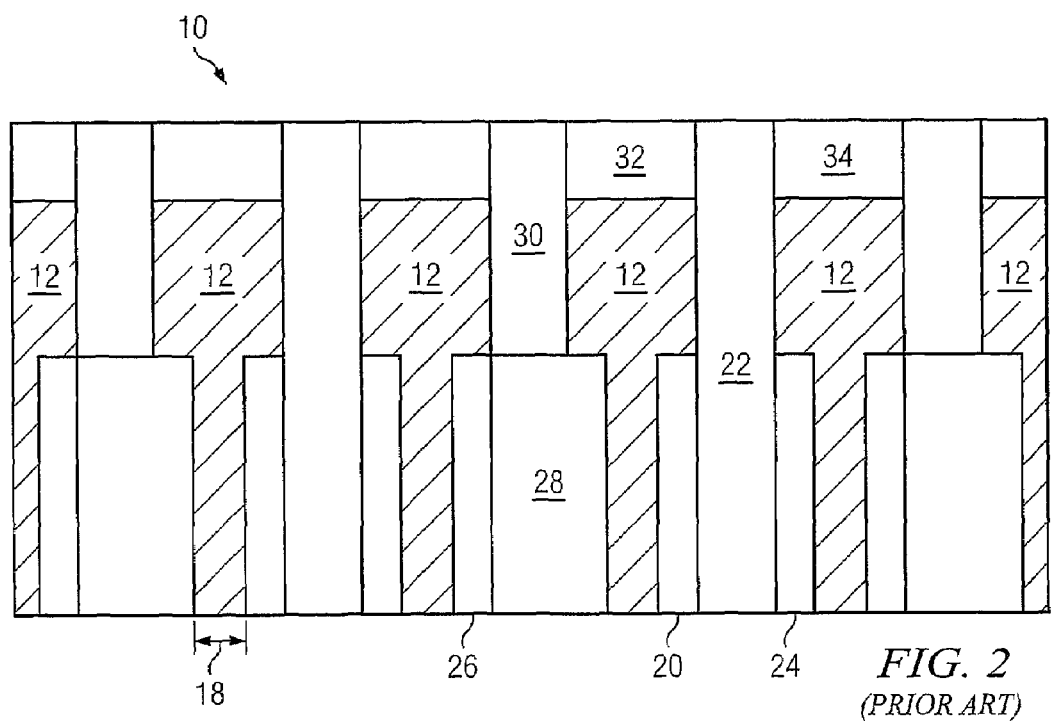
FIG. 2 illustrates a result of a conventional method of pattern fracturing of a target mask pattern.

FIG. 2 shows an example of how fracturing can be achieved conventionally. Because of the narrow width of the electron beam, exposed region 14 from FIG. 1 is fractured into smaller sections 20/22/24/26/28/30/32/34. Each of these smaller regions represents a single exposure shot of the mask writer into the photoresist of the mask. As is evident from FIG. 2, even though the mask pattern is regular and repeating, the fractured areas are not. Additionally, some of the areas are small slivers 26/20/24, while other areas comprise larger rectangles 28/22/34. Irregularity of the fracturing within the repeated segment 12 structure potentially creates mismatch errors between structures utilizing different fracture patterns.

When the width 18 of non-exposed segment 12 is on the order of a critical dimension, the conventional manner of fracturing poses a problem. Sections 20/22/24 which border segments comprising critical dimension 18 potentially creates a width error along the width of segment 12 because of an accumulated alignment error of the sections 20/22/24. Such alignment errors occur because the mask can be mechanically stepped between electron beam exposures during mask fabrication. Another error which can occur is an electron beam dose error. The absolute electron beam dose error for small slivers is potentially higher than for wider openings, so any systematic dose error causes critical dimension (CD) differences with differently fractured environments.

Figure 3A:
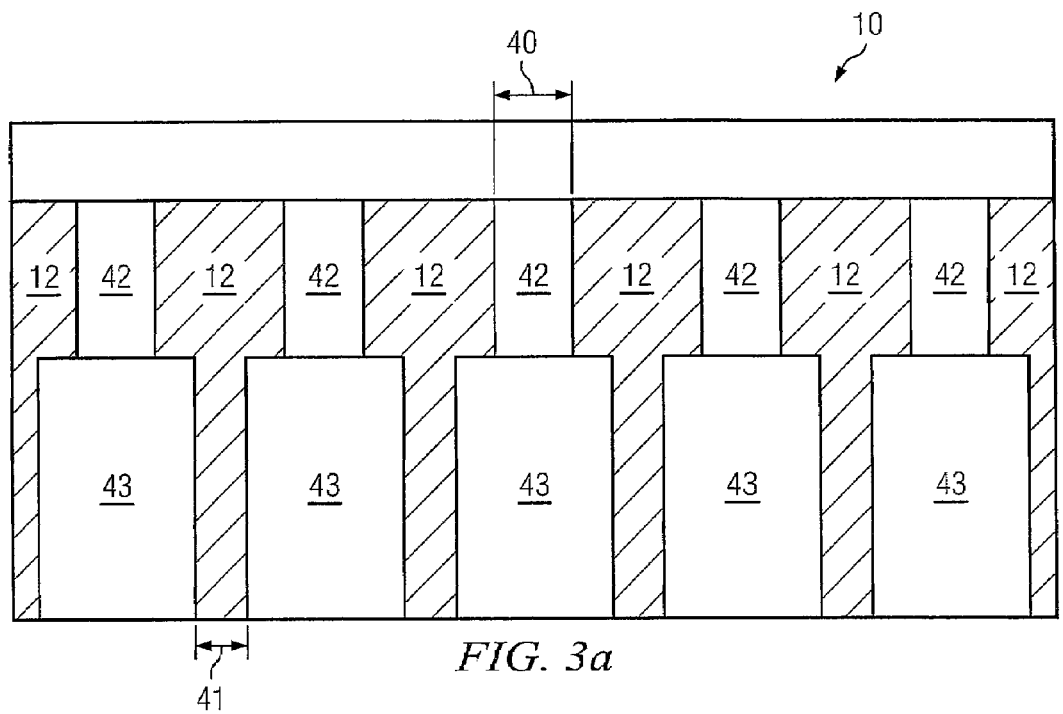
FIGS. 3a-3c illustrate one embodiment method of fracturing a target mask pattern.
Figure 3B:
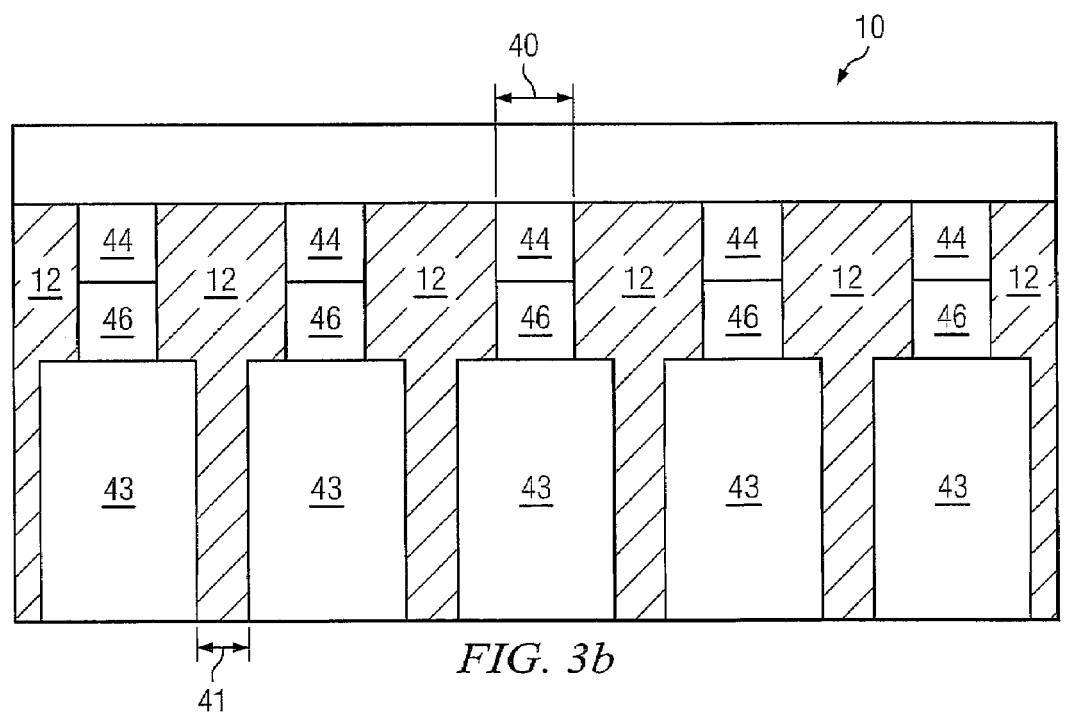
Figure 3C:
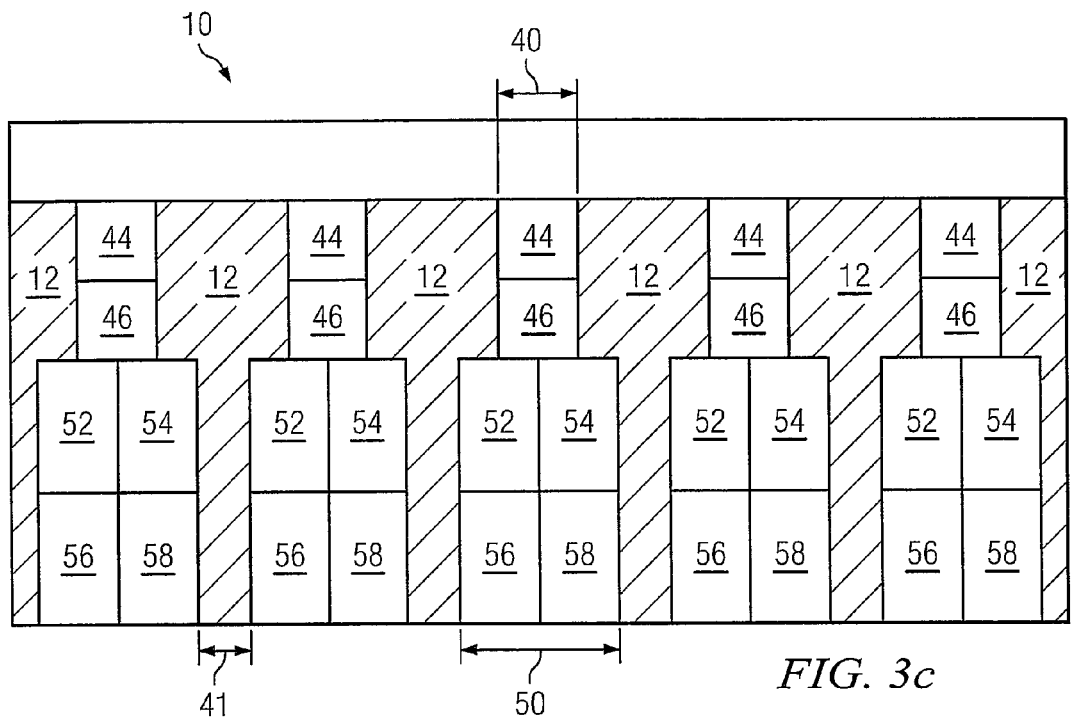

FIGS. 3a-3c show a first embodiment method of fracturing the exposed mask regions.

The first step of the first embodiment method is shown in FIG. 3a. In the first embodiment of the present invention, critical dimension geometries 40/41 are first found and critical dimension regions 42/43 are identified. The location of the critical dimension geometries and the identification of the critical dimension regions are typically accomplished by performing a computer search of provided target mask pattern database. Non-exposed and exposed regions having a width of a critical dimension are first flagged. Exposed regions having a width of a critical dimension and exposed regions adjoining non-exposed regions of a critical dimension are then identified. These geometric conditions are provided to the computer program performing the search.

Once the critical regions are identified, they are fractured according to a fracturing algorithm. In the first embodiment of the present invention, exposed regions that are the width of a critical dimension (CD) are fractured to preserve the dimension of critical width, if possible. For example, for a rectangular region with dimensions of CD by 4×CD, the fracturing algorithm would preserve the CD length and divide the region along the 4×CD dimension into segments equal or less than the maximum length supported by the electron beam writer. This electron beam length is typically in the range of about 0.1 nm to 2.5 μm in 4× dimensions. The usable minimum feature width, however, is limited by properties of the resist.

For exposed regions whose dimensions are greater than the critical dimension, the remaining area to be fractured is divided by the minimum number needed to make the divided areas exposed by one shot of the electron beam. For example, in FIG. 2, this would be the width of segment 30. The algorithm also minimizes the number of segments adjacent to non-exposed areas of a critical dimension. Once all of the exposed regions of critical dimension and regions neighboring non-exposed regions of critical dimensions are fractured, all remaining regions are then fractured using conventional techniques.

For a 45 nm process using a 4× mask, the critical mask dimension is typically 240 nm corresponding to a critical wafer dimension of 60 nm. For a 65 nm process using a 4× mask, the critical mask dimension is typically 260 nm corresponding to a critical wafer dimension of 65 nm; and for a 90 nm process using a 4× mask, the critical mask dimension is typically 360 nm corresponding to a critical wafer dimension of 90 nm. These critical dimensions are approximate and may vary according to process and equipment. Because of these smaller projected features, however, the accurate exposure of the mask is critical.

The illustration in FIG. 3b shows how the regions within the exposed critical dimension width 40 are fractured. In the first embodiment of the present invention, the critical dimension regions are fractured in a way to maintain a single region between non-exposed regions. For example, region 42 from FIG. 3a is split into regions 44 and 46 in FIG. 3b. The split in region 42 is made in a way that does not create accumulated exposure error because the boundary between regions 44/46 is perpendicular to the non-exposed regions 12 of critical dimension 40. Any accumulated exposure error will simply be offset into another exposed region.

FIG. 3c shows the fracturing of regions 43 from FIG. 3b. Here the regions between non-exposed regions of critical dimensions are fractured. In this case, however, the width of the region to be fractured exceeds the width of the electron beam, so this region will not be able to be fractured without keeping all boundaries perpendicular to the non-exposed regions 12. Region 43 is therefore fractured once along the width and once along the length. In this example, only two exposures are performed between non-exposed regions of critical dimension.

In a second embodiment (not shown), a database of pre-fractured exposed regions is given as an input to the fracturing algorithm. This database may contain the fracture definitions for some or for all of the exposed regions. The fracturing algorithm uses the pre-fractured database as a starting point and continues to fracture the remaining exposed regions as described herein above. This embodiment can be used to facilitate the predetermined pre-fracturing of repeated cells such as memory cells.

Figure 4A:
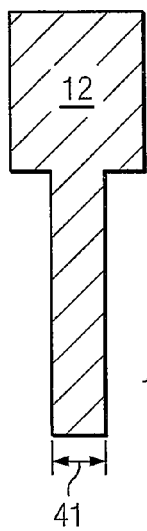
FIGS. 4a-4b illustrate an alternate embodiment method of fracturing a target mask pattern.
Figure 4B:
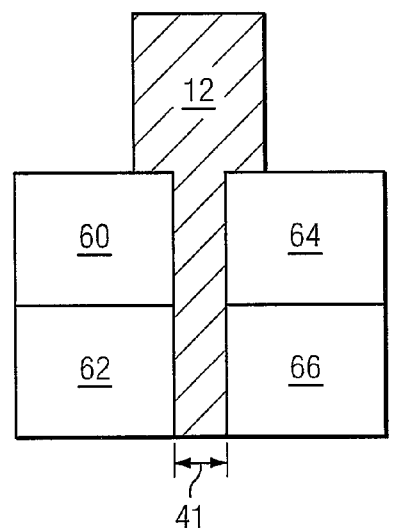

FIGS. 4a-4b describe a third embodiment fracturing algorithm. In the third embodiment, a non-exposed region 12 of a critical dimension is identified (FIG. 4a). Fractured shapes 60/62/64/66 (FIG. 4b) are placed adjacent to a portion of non-exposed region 12 so that a band of subshapes of a uniform width are adjacent to non-exposed region 12. These uniform subshapes will help to remove systematic variation caused by non-uniform fracturing. In cases where the fractured sub-shapes 60/62/64/66 touch, overlap, or reach into a non-exposed or not to be fractured region, the region is then divided according to the first or second embodiment discussed herein above, or according to the conventional art.

Figure 5:
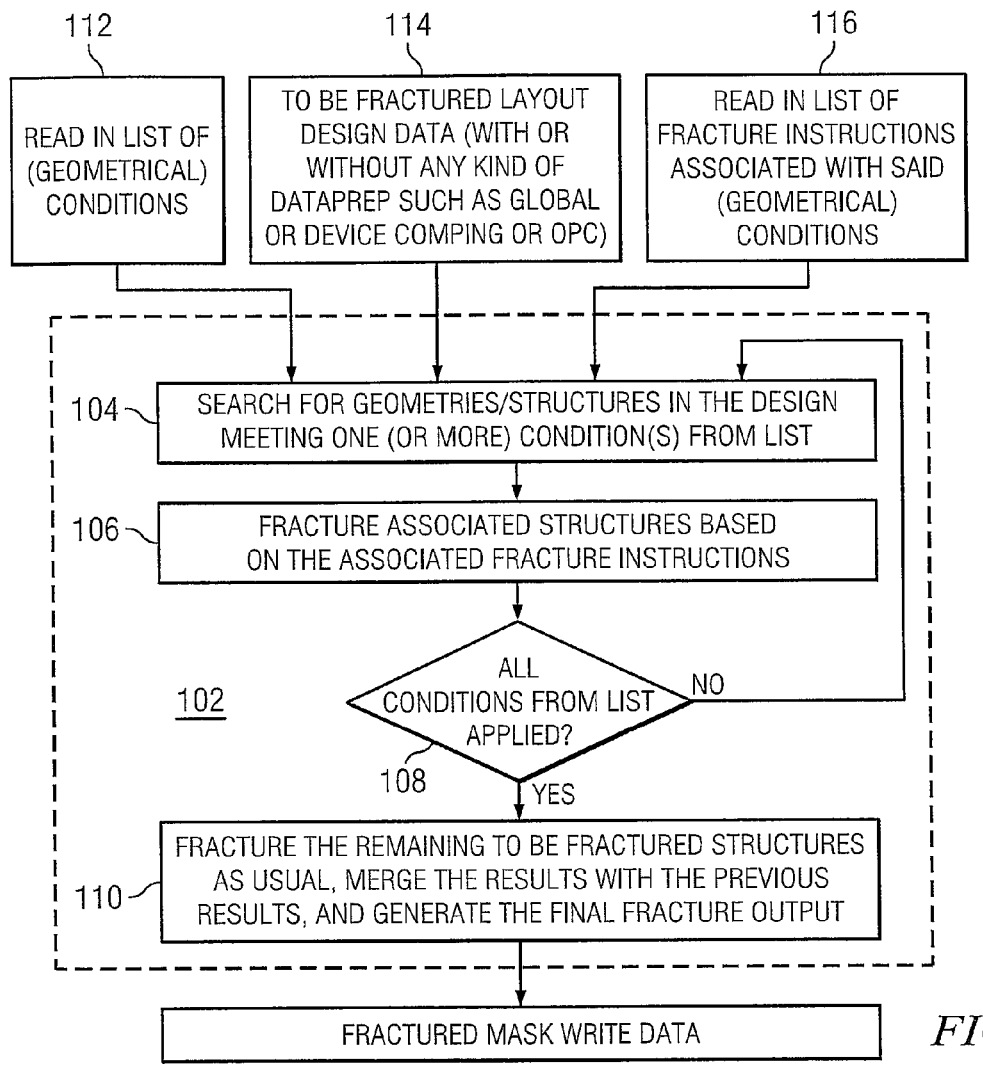
FIG. 5 shows a flowchart of an embodiment method of fracturing a mask pattern.

The flowchart in FIG. 5 describes the fracturing operation described herein. This process is preferably performed by a computer; however, the same operation could be performed manually. For example, a layout designer or engineer could manually determine the fractured geometry for a small memory cell that will be replicated millions of times on a semiconductor chip.

As shown in the flowchart, the input to the fracturing algorithm is layout design data 114, a list of geometrical conditions 112 and a list of fracture instructions 116. These inputs are provided to fracturing algorithm 102.

The first step in the fracturing algorithm, step 104, is to search for geometries and structures in the design database that match the list of geometrical conditions 112. Examples of these conditions are described herein above and are illustrated in FIGS. 3a-3c. Next, in step 106, structures are fractured based on the fracture instructions. The algorithm then checks, in step 108, to see if the conditions from the list of geometrical conditions 112 and the list of fracture instructions 116 are met. If all of the conditions are met, the remaining structures are fractured according to conventional fracture techniques 110, and the fractured results are then merged with the previously iterated results. Each iteration of the fracturing algorithm further fractures the design database. If there are still more conditions that need to be applied from the list of geometrical conditions 112, the algorithm iterates back to step 104 and continues to search for the remaining geometries on the list 112.

Figure 6:
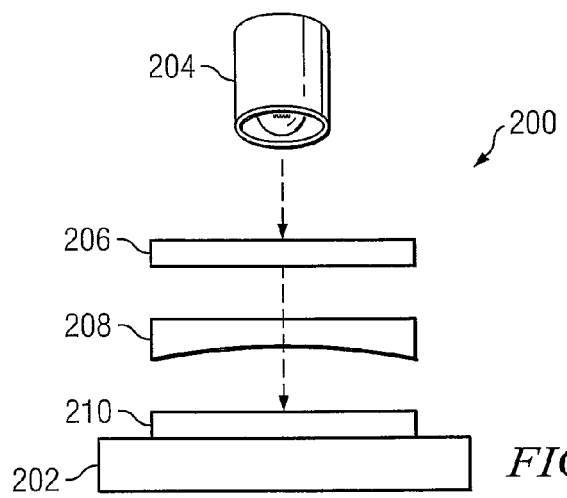
FIG. 6 shows a diagram of the photolithography system that can utilize a mask of the present invention.

In various embodiments of the invention, the mask can be designed to pattern structures created at a surface of a semiconductor, e.g., silicon, wafer. An apparatus 200 for patterning the surface of a semiconductor wafer 210 is shown in FIG. 6. A stage 202 is adapted to support a semiconductor wafer 210. The stage 202 may be adapted to move the entire wafer 210 from position to position in order to expose portions of a resist over the wafer 210 surface during the patterning process. The stage 202 may be mounted on a base, not shown. The stage 202 is adapted to securely hold the wafer 210 in place.

A lens 208 is disposed above the wafer 210. Lens 208 typically comprises a demagnification lens that reduces the image transferred to the wafer 210 by 4-5×, for example. While lens 208 is depicted in the figure as a single lens, lens 208 will in most cases include a system of lenses. Alternatively, no lens 208 may be required if a 1:1 ratio magnification scheme is used for transferring the pattern from the mask 206 to the wafer 210.

The mask 206 has the desired pattern to be transferred to the wafer 210 and is disposed above lens 208. This mask can be created as described above. A light or energy source 204 is disposed above mask 206, as shown.

To pattern the wafer 210, the light source 204, which may comprise a laser or ultraviolet light, for example, is illuminated. The light passes through the mask 206, through demagnification lens 208, and exposes portions of photoresist on the top surface of the semiconductor wafer 210.

There are various types of exposure tools that function similarly to the apparatus 200 described and illustrated in FIG. 6. In a step and repeat apparatus, the mask 206 pattern is transferred onto one section of the wafer 210 at a time, and a stage 202 moves the wafer 210 from point to point, exposing the wafer 210 surface in a plurality of steps. An alternative apparatus used to pattern and expose a wafer 210 surface is known as a step and scan apparatus, for example The present invention has been described in the context of a mask for a semiconductor wafer. It is understood, however, that other workpieces can be produced using the concepts described herein. For example, a mask can be used to pattern things other than semiconductor wafers. Alternatively, the concepts can be used to directly write a pattern onto a semiconductor wafer or other workpiece that is not a mask. Other alternatives are also possible.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
    providing a target pattern for a lithography mask, the target pattern including features to be exposed on the lithography mask, the features to be exposed being separated by unexposed regions;
    searching the target pattern for geometries that meet one or more conditions;
    based on results of the searching, identifying pattern structures to be fractured, identifying pattern structures to be fractured comprising finding unexposed features with at least one dimension equal to a critical dimension and locating features to be exposed that are adjacent to the found unexposed features;
    fracturing the identified pattern structures according to a fracture instruction list;
    creating a set of exposure patterns, the exposure patterns being based on the fractured identified pattern structures; and
    exposing the lithography mask in accordance with the exposure patterns, the lithography mask thereafter including a plurality of patterned structures based at least in part on the exposing; and
    making a semiconductor device using the lithography mask.

2. The method of claim 1, wherein searching the target pattern for geometries comprises comparing dimensions of the unexposed regions on the target pattern to the critical dimension.

3. The method of claim 1, wherein fracturing the identified pattern structures comprises dividing the located features to be exposed in a manner that minimizes the number of segments adjacent to the found unexposed features.

4. The method of claim 1, wherein fracturing the identified pattern structures comprises dividing the regions of features to be exposed adjacent to the unexposed features of critical dimension into regions of a minimum width and depth.

5. The method of claim 4, wherein the regions of a minimum width and depth have either a width of a critical dimension or a depth of a critical dimension.

6. The method of claim 4, wherein the regions of a minimum width and depth are uniform.

7. The method of claim 1, wherein searching the target pattern for geometries comprises comparing dimensions of the exposed structures on the target pattern to a critical dimension.

8. The method of claim 7, wherein the fracturing comprises dividing the identified exposed structures into segments with one dimension equal to the critical dimension, and another dimension equal to a maximum value.

9. The method of claim 8, wherein the maximum value is the maximum width a electron beam writer can expose a target.

10. The method of claim 1, wherein the fractured instruction list includes a list of pre-fractured sub-shapes.

11. The method of claim 1, wherein the fracturing divides the exposed areas in segments with a minimum height to width ratio of about 1:2.

12. The method of claim 1, wherein making the semiconductor device comprises:
    forming a layer of resist at an upper surface of a semiconductor wafer;
    exposing the layer of resist through the lithography mask;
    removing portions of the layer of resist based upon the exposing; and
    affecting the upper surface of the semiconductor wafer at regions where the portions of the layer of resist have been removed.

13. The method of claim 12, wherein affecting the upper surface comprises etching a material at the upper surface.

14. A method of forming a pattern on a workpiece, the method comprising:
    providing a target pattern, the target pattern including features to be exposed on the workpiece, the features to be exposed being separated by unexposed regions;
    searching the target pattern for geometries that meet one or more conditions;
    based on results of the searching, identifying pattern structures to be fractured, identifying pattern structures to be fractured comprising finding unexposed features with at least one dimension equal to a critical dimension and locating features to be exposed that are adjacent to the found unexposed features;
    fracturing the identified pattern structures according to a fracture instruction list;
    creating a set of exposure patterns, the exposure patterns being based on the fractured identified pattern structures; and
    exposing the workpiece in accordance with the exposure patterns.

15. The method of claim 14, wherein searching the target pattern for geometries comprises comparing dimensions of the unexposed regions on the target pattern to the critical dimension.

16. The method of claim 14, wherein fracturing the identified pattern structures comprises dividing the located features to be exposed in a manner that minimizes the number of segments adjacent to the found unexposed features.

17. The method of claim 14, wherein fracturing the identified pattern structures comprises dividing the regions of features to be exposed adjacent to the unexposed features of critical dimension into regions of a minimum width and depth.

18. The method of claim 17, wherein the regions of a minimum width and depth have either a width of a critical dimension or a depth of a critical dimension.

19. The method of claim 17, wherein the regions of a minimum width and depth are uniform.

20. The method of claim 14, wherein searching the target pattern for geometries comprises comparing dimensions of the exposed structures on the target pattern to a critical dimension.

21. The method of claim 20, wherein identifying pattern structures to be fractured comprises finding exposed features with at least one dimension equal to the critical dimension.

22. The method of claim 21, wherein the fracturing comprises dividing the identified exposed structures into segments with one dimension equal to the critical dimension, and another dimension equal to a maximum value.

23. The method of claim 22, wherein the maximum value is the maximum width a electron beam writer can expose a target.

24. The method of claim 14, wherein the workpiece comprises a lithography mask.

25. A method of making a semiconductor device, the method comprising:
    providing a mask with a pattern formed thereon, the mask comprising exposed features and unexposed features, the exposed features being fractured according to an algorithm, the algorithm comprising:
        searching a target pattern for geometries that meet one or more conditions related to a critical dimension;
        based on results of the searching, identifying pattern structures to be fractured, identifying pattern structures to be fractured comprising finding unexposed features with at least one dimension equal to a critical dimension and locating features to be exposed that are adjacent to the found unexposed features; and
        fracturing the identified pattern structures according to a fracture instruction list;
    providing a semiconductor wafer having a resist layer formed thereon;
    irradiating the resist layer through the mask;
    developing the resist layer to expose an upper surface of a wafer thereby forming a resulting pattern; and
    performing a process to affect the upper surface of the wafer in resulting pattern.

26. The method of claim 25, wherein providing the mask comprises:
    creating a set of exposure patterns, the exposure patterns being based on the fractured identified pattern structures; and
    exposing the mask in accordance with the exposure patterns.

27. The method of claim 25, wherein searching the target pattern for geometries comprises comparing dimensions of the unexposed regions on the target pattern to the critical dimension.

28. A method for generating a mask pattern using a computer, the method comprising:
    the computer receiving a layout design to be fractured;
    the computer receiving a list of geometrical conditions;
    the computer receiving a list of fracture instructions for the geometrical conditions;

the computer creating a list of geometric features by searching for geometries in the layout design that meet one or more conditions on the list of geometrical conditions;

the computer identifying structures to be fractured based upon the list of geometric features, identifying pattern structures to be fractured comprising finding unexposed features with at least one dimension equal to a critical dimension and locating features to be exposed that are adjacent to the found unexposed features; and the computer fracturing the identified structures.

29. The method of claim 28, further comprising the computer writing the fractured mask to a computer file.

30. The method of claim 28, wherein the geometrical conditions include at least one critical dimension.

* * * * *